(12) United States Patent
Jana et al.

(10) Patent No.: US 10,592,624 B2
(45) Date of Patent: Mar. 17, 2020

(54) EFFICIENT MECHANISM OF FAULT QUALIFICATION USING FORMAL VERIFICATION

(71) Applicant: Synopsys, Inc., Mountain View, CA (US)

(72) Inventors: Sandeep Jana, Bangalore (IN);
Arunava Saha, Sunnyvale, CA (US);
Pratik Mahajan, Cupertino, CA (US);
Per Bjesse, Portland, OR (US); Alfred Koelbl, Hillsboro, OR (US)

(73) Assignee: Synopsis, Inc., Mountain View, CA (US)

( * ) Notice: Subject to any disclaimer, the term of this patent is extended or adjusted under 35 U.S.C. 154(b) by 61 days.

(21) Appl. No.: 15/996,307

(22) Filed: Jun. 1, 2018

(65) Prior Publication Data
US 2018/0349521 A1 Dec. 6, 2018

(30) Foreign Application Priority Data
Jun. 2, 2017 (IN) .............................. 201741019497

(51) Int. Cl.
*G06F 17/50* (2006.01)
(52) U.S. Cl.
CPC ........ *G06F 17/504* (2013.01); *G06F 17/5022* (2013.01)

(58) Field of Classification Search
CPC ........................... G06F 17/504; G06F 17/5022
USPC .......................................................... 716/106
See application file for complete search history.

(56) References Cited

U.S. PATENT DOCUMENTS

| 8,990,746 | B1 | 3/2015 | Goyal et al. |
| 9,021,409 | B2 * | 4/2015 | Vasudevan et al. .. G06F 17/504 716/106 |
| 2014/0046647 | A1 | 2/2014 | Tsai et al. |
| 2015/0161306 | A1 | 6/2015 | Smith et al. |
| 2015/0213167 | A1 | 7/2015 | Jain et al. |
| 2015/0254383 | A1 | 9/2015 | Tso-Sheng et al. |
| 2018/0364298 | A1 * | 12/2018 | Grosse et al. ..... G01R 31/2839 |

OTHER PUBLICATIONS

Darbari, A. et al., "A Novel Transient Fault Injection Methodology Based on STE Model Checking," ARM, 2008, 7 pages.
Darbari, A. et al., "A New Approach for Transient Fault Injection Using Symbolic Simulation," IEEE, 2008, 7 pages.
Pattabiraman, K. et al., "SymPLFIED: Symbolic Program Level Fault Injection and Error Detection Framework," IEEE, 2013, pp. 1-15.

* cited by examiner

*Primary Examiner* — Sun J Lin
(74) *Attorney, Agent, or Firm* — Fenwick & West LLP

(57) ABSTRACT

The fault analysis problem is modelled by automatically creating additional properties (fault properties) and constraints based on a plurality of injected faults and existing user assertions. These fault properties and constraints are sent to formal verification in a single run to qualify all of the faults together, rather than sequentially checking each fault in a separate formal verification run.

20 Claims, 3 Drawing Sheets

EFFICIENT MECHANISM OF FAULT QUALIFICATION USING FORMAL VERIFICATION

CROSS-REFERENCE TO RELATED APPLICATION(S)

This application claims priority to Indian patent application 201741019497, "Efficient Mechanism of Fault Qualification Using Formal Verification," filed Jun. 2, 2017. The subject matter of all of the foregoing is incorporated herein by reference in its entirety.

BACKGROUND

1. Technical Field

This disclosure relates generally to formal property verification.

2. Description of Related Art

An important problem in doing signoff with formal property verification for integrated circuit designs is to understand if there are enough assertions to adequately cover the design functionality. In other words, if the circuit design has a bug, will the existing assertions (formal test bench) catch it? If not, then that would indicate a weakness in the formal verification environment.

A potential solution to address this problem is to use tools like Certitude to automatically insert artificial bugs called faults in the design and then to run formal property verification on the mutated design to find areas of the design whose faults are not caught by any of the existing assertions.

If a fault is not detected i.e. all assertions (which pass on the original design) also pass on the mutated design, then that would imply that an associated assertion is missing in the formal test bench to catch that bug.

Although this solution works conceptually, an important issue affects its widespread usage for real designs. In conventional solutions, each fault is enabled one at a time and formal verification of the user assertions are run separately for each fault. This sequential mode of operation implies significantly long run time to qualify all of the faults and hence does not scale well for larger real-world designs.

As an example, suppose there are approximately 10,000 instrumented faults and each formal run with one fault takes about 2 hours on average. At that rate, a verification engineer will spend about 2.5 years to gauge a signoff criteria, which is impractical. Executing a few runs in parallel will reduce overall turnaround time, but it will still be far from usable even after consuming plenty of expensive resources.

SUMMARY

In one aspect, the fault analysis problem is addressed by automatically creating additional properties (referred to as fault properties) and corresponding constraints based on the injected faults and the user assertions. These artificial fault properties and constraints may be sent to formal verification in a single run or a limited number of runs to qualify all the faults (or a large subset of faults) together rather than sequentially checking each fault using formal verification. A single run may also enable intelligent customized formal analysis exploring the localized nature of the faults and information sharing which results in much faster run-time of these additional fault properties. The automated formulation of the formal verification environment including the additional fault property and constraint modelling may be used to enable a level of parallelism which significantly reduces run-time.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary embodiments. In the interest of not obscuring the presentation of embodiments of the claimed inventions, in the following Detailed Description, some processing steps or operations that are known in the art may have been combined together for presentation and for illustration purposes and in some instances may have not been described in detail. However, a person skilled in the art will recognize that these embodiments may be used in commerce without these specific details or with equivalents thereof. In other instances, well-known processes and devices are not described in detail as not to unnecessarily obscure aspects of these embodiments. In other instances, some processing steps or operations that are known in the art may not be described at all. The following description is instead focused on the distinctive features or elements of various embodiments of the claimed inventions. Furthermore, while this description may refer to some components of the structure in the singular tense, more than one component may be depicted throughout the figures and like components are labeled with like numerals.

Figure 1:
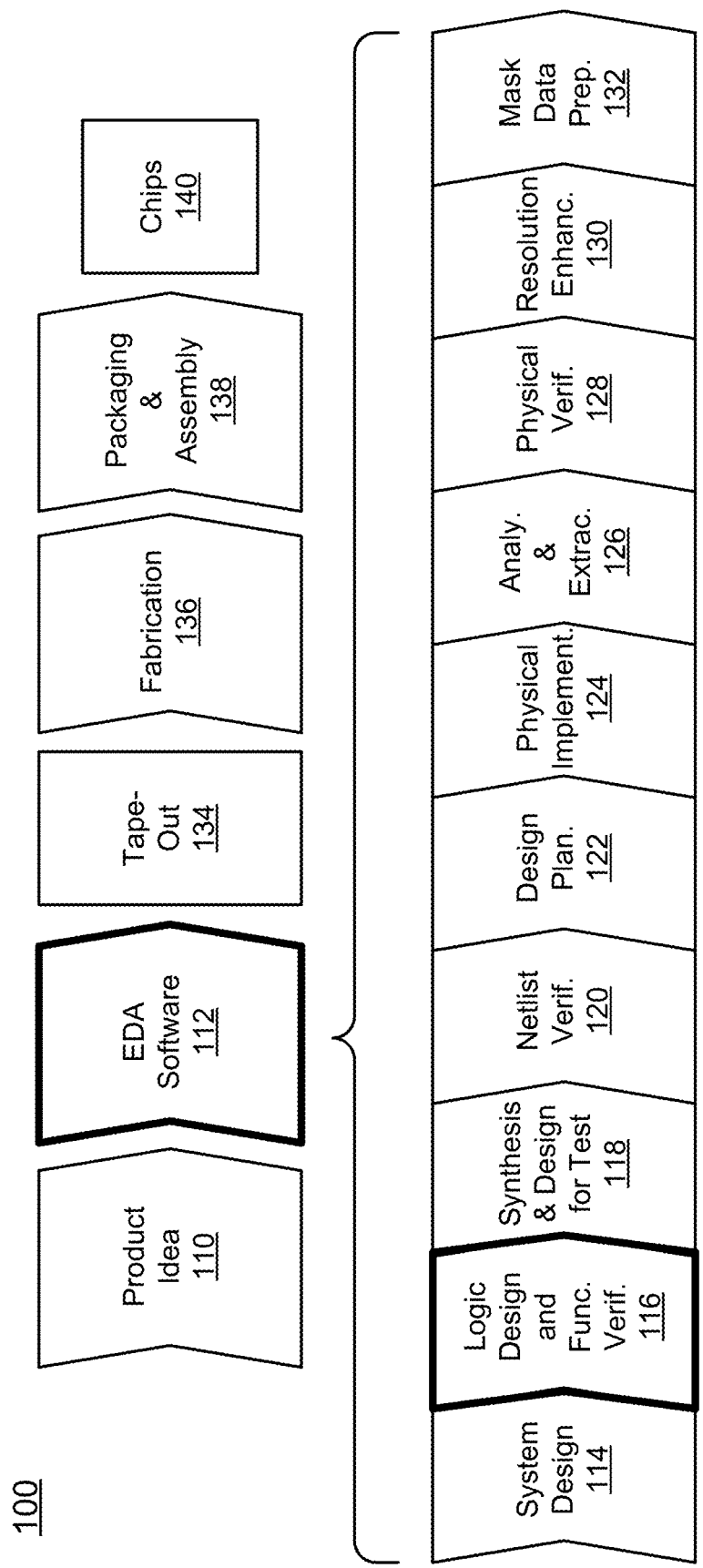
FIG. 1 is a flowchart illustrating various operations in the design and fabrication of an integrated circuit.

FIG. 1 illustrates various processes performed in the design and fabrication of an integrated circuit using software tools with a computer to transform data and instructions that represent the integrated circuit. These processes start with the generation of a product idea 110 with information supplied by a designer and is realized during a design process that uses EDA software tools 112, which may also be signified herein as EDA software, as a design tool or a verification tool. When the design is finalized, it can be taped-out 134. After tape-out, a semiconductor die is fabricated 136 and packaging and assembly processes 138 are performed, which result in the finished integrated circuit 140 which may also be signified herein as a circuit, device, component, chip or SoC (system on chip).

Note that the design process that uses EDA software tools 112 includes operations 114-132, which are described below. This design flow description is for illustration purposes only and is not meant to limit the present disclosure. For example, an actual integrated circuit design may require a designer to perform the design operations in a different sequence than the sequence described herein.

During system design 114, a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products.

Then, during logic design and functional verification 116, VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test 118, VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification 120, the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning 122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation 124, the placement positioning of circuit elements such as transistors or capacitors and routing connection of the same by a plurality of conductors occurs. Exemplary EDA software products from Synopsys, Inc. of Mountain View, Calif. that can be used at this stage include: the Astro and IC Compiler products.

Then, during analysis and extraction 126, the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification 128, the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement 130, geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation 132, the 'tape-out' data for production of masks to produce finished integrated circuits is provided. Exemplary EDA software products from Synopsys, Inc. of Mountain View, Calif. that can be used at this stage include the Cats. family of products.

For all of the above mentioned integrated circuit design tools, similar tools from other EDA vendors, such as Cadence and Mentor Graphics, can be used as an alternative. Additionally, similarly non-commercial tools available from universities can be used.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Embodiments of the present disclosure can be used during one or more of the above-described stages. Specifically, some embodiments of the present disclosure can be used in EDA software 112 as a part of logic design and functional verification 116.

One type of functional verification 116 is formal verification. In formal verification, the functionality of a design of an integrated circuit is tested or verified using formal proofs. The formal verification environment includes a number of properties and constraints. The properties include user assertions, which are used to validate the functionality of the circuit design. Known methods are used to prove or disprove the user assertions, subject to the given constraints, thus indicating whether the circuit design has the correct functionality.

One aspect of formal verification is determining whether the user assertions are adequate for testing the functionality of the integrated circuit design. Will the user assertions catch all bugs in the integrated circuit design? One approach is to intentionally inject bugs (faults) into the integrated circuit design and then run the formal verification environment and observe whether the user assertions detect the injected faults. If some injected faults are not detected, then there is a hole in the coverage of the user assertions.

A solution to automate the modelling of the fault analysis problem for formal verification is to create additional properties (referred to as fault properties) and constraints based on the injected faults (e.g., the fault enable signals) and the user assertions. These fault properties and additional constraints allow multiple faults to be evaluated in parallel in a single run of the formal verification tool.

Figure 2:
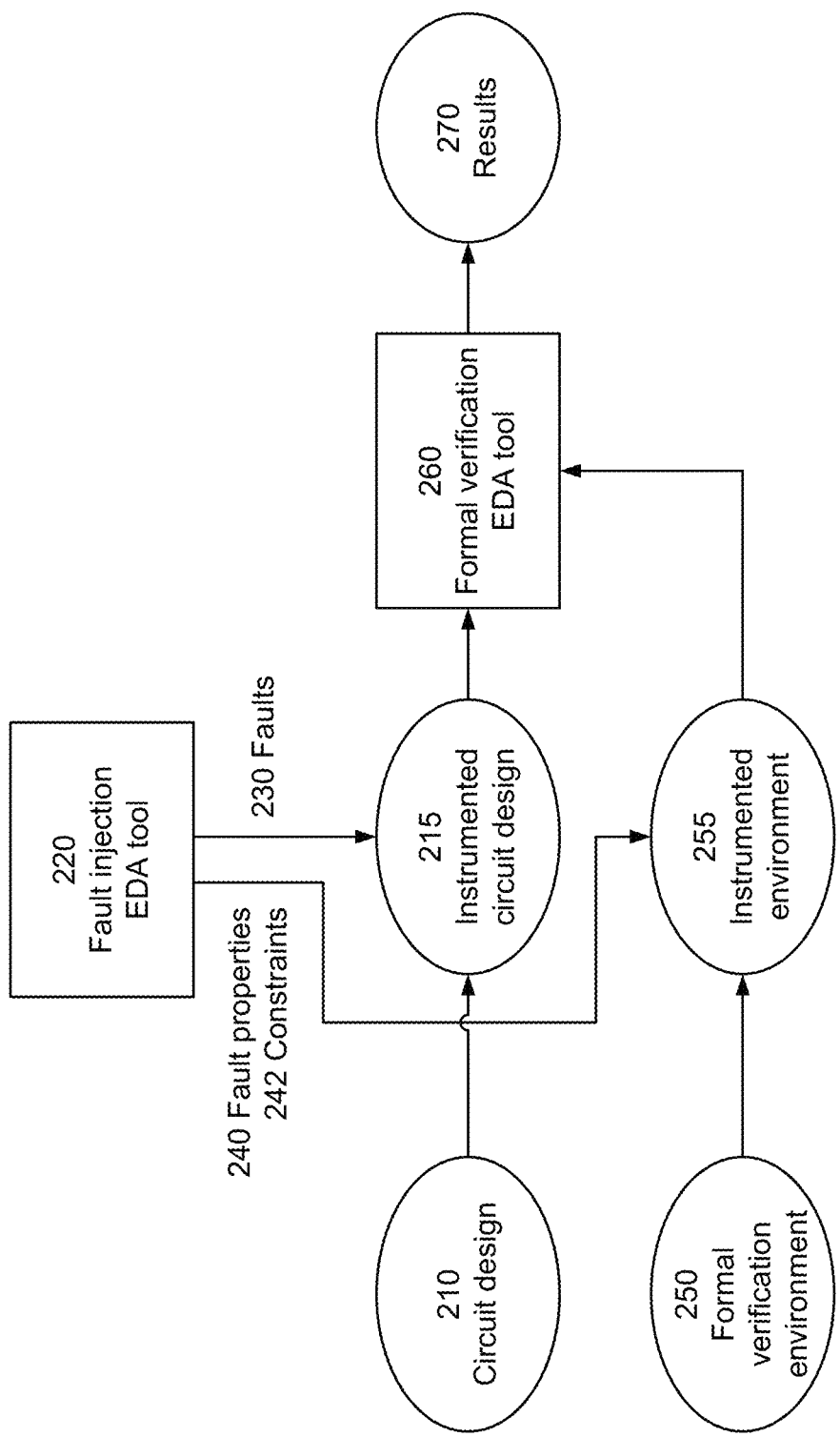
FIG. 2 is a diagram of a flow for determining whether user assertions provide adequate coverage for formal verification, according to an embodiment.

FIG. 2 is a diagram of a flow for determining whether user assertions provide adequate coverage, according to an embodiment. The integrated circuit design 210 is the design under test. A fault injection EDA tool 220 (e.g., Certitude from Synopsys) injects multiple faults 230 into the circuit design 210. The result 215 is the original design plus faults, sometimes referred to as the mutated design or the instrumented design. For example, if the original design 210 is an RTL-level design, each fault may be injected as a version of the original circuitry with the fault, plus an enable signal. If the enable signal is asserted, the version with fault is selected. Otherwise, the version without fault is selected.

The EDA tool 220 also creates corresponding fault properties 240 and constraints 242. These are additional properties and constraints are added to the formal verification environment 250 which also contains the user assertions. The formal verification environment 255 with these additions is then run. In FIG. 2, a formal verification EDA tool 260 (e.g., VC-Formal from Synopsys) performs the formal verification. A single run of the formal verification environment 255 evaluates all of the fault properties 240, subject to the additional constraints 242. The results 270 of these evaluations indicate whether the user assertions are adequate to cover the injected faults 230.

Let M be the number of faults 230 injected into the design 210, where m is the index for the faults (m=1 ... M). In one approach, M fault properties 240 are created, one for each fault. Each fault property 240, fault_prop_m, along with the added constraints 242, models the behavior that if the corresponding fault_m is enabled and all other faults are disabled and none of the user assertion fails, then that fault property fault_prop_m is proven. A proven fault property indicates that the corresponding fault_m was not caught by any user assertion and hence implies weakness in the overall verification environment 250.

A fault property fault_prop_m that evaluates to false implies that there is a user assertion to catch the corresponding fault_m. All M of these fault properties along with the additional constraints can be sent to formal verification in one single run that performs the fault qualification of the entire design (or a significant subset of the design). Hence there is no need to enable each fault one at a time and then to run formal verification separately for each fault. The additional fault properties and constraints are modelled such that each fault property fault_prop_m represents the corresponding fault_m being enabled and checking for the effect of that fault on the user assertions. This single invocation of formal verification for qualifying all M faults, as opposed to a sequential invocation, makes this approach much faster and scalable for adoption in real designs.

Figure 3:
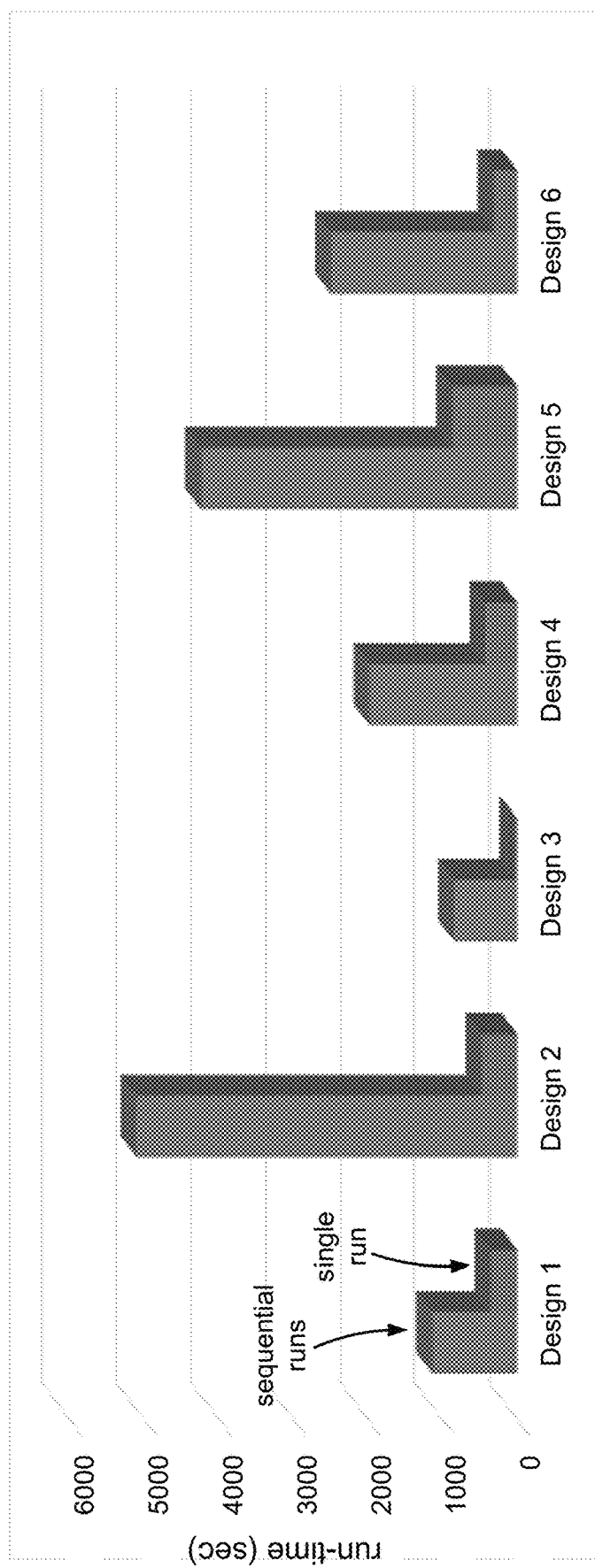
FIG. 3 is a graph comparing run-time (in sec) of the flow shown in FIG. 2 against a conventional flow that invokes formal verification sequentially for each fault.

FIG. 3 is a graph comparing run-time (in seconds) of the flow shown in FIG. 2 against a conventional flow that invokes formal verification separately for each fault. These results are shown for six different real-world designs. The left bar of each pair shows the run-time of the conventional approach that invokes separate, sequential formal verification runs for each fault. The right bar shows the run-time when formal verification is invoked once to evaluate all faults. In these six designs, the number of faults evaluated, M, ranges from 100 to 5,000, although other values of M are also possible. Speed-ups ranging from 5× to 10× were achieved, although other speed-ups are also possible.

The following is an example of the fault properties 240 to be created. Assume that there are M faults injected into the design and there are N user assertions in the formal testbench. Each of the M faults can be represented by an enable bit of a register ([M−1:0] fault_reg) that is added to the circuit design. Each of the N user properties can be represented as prop_1, prop_2, ... prop_N and their corresponding modelled signals as prop_sig_1, prop_sig_2, ... prop_sig_N. Now for each fault (fault_reg[m]) injected into the design, create a fault property as follows:

fault_prop_m:assert property (@ (posedge clk) fault_reg[m]–>(prop_sig_1 && prop_sig_2 && prop_sig_3 && ... && prop_sig_N)

Here, the notation is SVA (System Verilog Assertion). This fault property asserts that enabling the injected fault implies that none of the user assertions are violated. Therefore, proving this fault property indicates that the user assertions are not adequate to detect the corresponding injected fault.

In addition to the fault properties 240, additional constraints 242 may also be created. In this example, a stability constraint and a one-hot constraint are created. The stability constraint on the fault register is:

fault_stbl_constr:assume property (@ (posedge clk) $stable(fault_reg))

This ensures that if a fault is enabled/disabled then it remains stuck to that value and does not change throughout the run. That is, if an injected fault is enabled then it remains enabled for the entire run of the formal verification environment and if an injected fault is disabled then it remains disabled for the entire run of the formal verification environment.

The one-hot constraint on the fault register is:

fault_one_hot_constr:assume property (@ (posedge clk) $onehot(fault_reg))

This ensures that only one fault can be enabled at a time. That is, if an injected fault is enabled then all the other injected faults are disabled.

Each fault property fault_prop_m combined with the added constraints models the following behavior. If a fault_m is enabled and all other faults are disabled and none of the user assertions fails, then that fault property fault_prop_m is proven. A proven fault property fault_prop_m indicates that the corresponding fault_m was not caught by any user assertion and hence implies weakness in the overall verification environment. A falsified fault property fault_prop_m implies that there is a user assertion to catch that fault/bug fault_m.

If there are M faults injected into the design, then M fault properties are created. All M of these fault properties along with the stability and one-hot constraints are sent to formal verification. In one single run, the fault qualification of all M faults is completed. This could cover all of the faults for the design.

There is no need of enable each fault one at a time and then to run formal verification separately for each fault. The additional fault properties and constraints are modelled such that each fault property represents each fault being enabled and checks for the effect of that fault on the user assertions. This single invocation of formal verification for qualifying all faults as opposed to the sequential invocation used in conventional approaches is much faster and makes this approach to analyzing coverage of faults scalable for adoption in real-world designs.

This fault property modelling enables running all M faults together, although at each instrumented fault property level they will be evaluated separately. These fault properties will be running together in a single session and can share engine level information among each other using traditional techniques to enable faster convergence.

This approach can significantly improve formal verification performance for doing fault analysis. This will enhance adoption of formal verification for fault qualification and may enable formal-signoff of design blocks (without simulation). Another advantage is a much tighter integration of the fault injection tool with a formal verification tool.

In the approach shown in FIG. 2, the fault injection EDA tool 220 (e.g., Certitude) interfaces to a formal verification EDA tool 260 (e.g., VC-Formal). This is a two-step process. The fault injection EDA tool 220 injects the faults and creates the fault properties and constraints. The fault instrumented RTL design and additional fault properties and constraints are then handed to the formal verification EDA tool 260, which compiles and performs the formal verification.

However, in an alternate approach, both of these functions may be performed by a single EDA tool. The fault injection is invoked as part of the front-end compilation of the formal verification EDA tool and the verification of the additional fault properties can be done directly on the fault injected design. In this approach, there is no need to do a separate compile with formal verification.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

In alternate embodiments, the invention is implemented in computer hardware, firmware, software, and/or combinations thereof. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and other forms of hardware.

What is claimed is:

1. A method implemented on a computer system comprising a processor, the processor executing instructions to effect a method for checking an adequacy of user assertions in a formal verification environment that tests a functionality of a design for an integrated circuit, the method comprising:
   injecting a plurality of faults into the design for the integrated circuit; and
   creating a plurality of fault properties based on the plurality of injected faults and the user assertions, wherein the plurality of fault properties are suitable for addition to the formal verification environment, all of the plurality of fault properties can be evaluated in a single run of the formal verification environment, and an evaluation of the plurality of fault properties indicates whether the user assertions are adequate to detect the plurality of injected faults.

2. The computer-implemented method of claim 1 wherein the evaluation of the plurality of fault properties also indicates which, if any, of the plurality of injected faults is not detectable by the user assertions.

3. The computer-implemented method of claim 1 wherein one fault property is created for each injected fault of the plurality of inject faults and evaluation of said one fault property indicates whether the user assertions are adequate to detect a corresponding injected fault.

4. The computer-implemented method of claim 3 wherein proving one fault property of the plurality of fault properties indicates that the user assertions are not adequate to detect the corresponding injected fault.

5. The computer-implemented method of claim 4 wherein the fault property for each injected fault asserts that enabling the injected fault implies that none of the user assertions are violated.

6. The computer-implemented method of claim 3 wherein each injected fault of the plurality of injected faults is represented by an enable bit in a register added to the design for the integrated circuit.

7. The computer-implemented method of claim 1 further comprising:
   creating one or more additional constraints for the formal verification environment, the additional constraints applying to evaluation of the plurality of fault properties.

8. The computer-implemented method of claim 7 wherein one of the additional constraints specifies that if any injected fault is enabled then it remains enabled for an entire run of the formal verification environment and if any injected fault is disabled then it remains disabled for the entire run of the formal verification environment.

9. The computer-implemented method of claim 7 wherein one of the additional constraints specifies that if any injected fault is enabled then all the other injected faults are disabled.

10. The computer-implemented method of claim 1 wherein the plurality of faults are injected into an RTL-level design of the integrated circuit.

11. The computer-implemented method of claim 1 further comprising:
   adding the plurality of fault properties to the formal verification environment.

12. The computer-implemented method of claim 11 further comprising:

executing a single run of the formal verification environment, wherein all of the plurality of fault properties are evaluated in the single run of the formal verification environment.

13. The computer-implemented method of claim 12 wherein the executing a single run of the formal verification environment requires less run-time than executing a separate run of the formal verification environment for each injected fault.

14. The computer-implemented method of claim 12 wherein more than 1,000 faults are injected into the design for the integrated circuit, and the single run of the formal verification environment indicates whether the user assertions are adequate to detect all of the injected faults.

15. The computer-implemented method of claim 12 wherein:
a first EDA tool injects the plurality of faults into the design for the integrated circuit and creates the plurality of fault properties; and
a second separate EDA tool executes the single run of the formal verification environment.

16. The computer-implemented method of claim 12 wherein a single EDA tool injects the plurality of faults into the design for the integrated circuit, creates the plurality of fault properties, adds the fault properties to the formal verification environment, and executes the single run of the formal verification environment.

17. A method implemented on a computer system comprising a processor, the processor executing instructions to effect a method for checking an adequacy of user assertions in a formal verification environment that tests a functionality of a design for an integrated circuit, the method comprising:
injecting a plurality of faults into the design for the integrated circuit;
creating a fault property for the formal verification environment for each injected fault of the plurality of injected faults, wherein the fault property corresponding to said each injected fault asserts that enabling the injected fault implies that none of the user assertions are violated;
creating a stability constraint for the formal verification environment, the stability constraint specifying that if any injected fault is enabled then it remains enabled for an entire run of the formal verification environment and if any injected fault is disabled then it remains disabled for the entire run of the formal verification environment; and
creating a one-hot constraint for the formal verification environment, the one-hot constraint specifying that if any injected fault is enabled then all the other injected faults are disabled;
wherein all of the fault properties can be evaluated in a single run of the formal verification environment subject to the stability constraint and to the one-hot constraint.

18. The computer-implemented method of claim 17 wherein each injected fault of the plurality of injected faults is represented by an enable bit in a register added to an RTL-level design for the integrated circuit.

19. The computer-implemented method of claim 17 further comprising:
adding the plurality of fault properties, the stability constraint and the one-hot constraint to the formal verification environment; and
executing a single run of the formal verification environment, wherein all of the plurality of fault properties are evaluated in the single run of the formal verification environment subject to the stability constraint and to the one-hot constraint.

20. A system for checking an adequacy of user assertions in a formal verification environment that tests a functionality of a design for an integrated circuit, the system comprising:
a first computer module that:
injects a plurality of faults into the design for the integrated circuit;
creates a fault property for the formal verification environment for each injected fault of the plurality of injected faults, wherein the fault property corresponding to each injected fault asserts that enabling the injected fault implies that none of the user assertions are violated;
creates a stability constraint for the formal verification environment, the stability constraint specifying that if any injected fault is enabled then it remains enabled for an entire run of the formal verification environment and if any injected fault is disabled then it remains disabled for the entire run of the formal verification environment; and
creates a one-hot constraint for the formal verification environment, the one-hot constraint specifying that if any injected fault of the plurality of injected faults is enabled then all the other injected faults of the plurality of injected faults are disabled; and
a second computer module that:
executes a single run of the formal verification environment that includes the plurality of fault properties, the stability constraint and the one-hot constraint; wherein all of the plurality of fault properties are evaluated in the single run of the formal verification environment subject to the stability constraint and to the one-hot constraint.

* * * * *

UNITED STATES PATENT AND TRADEMARK OFFICE
CERTIFICATE OF CORRECTION

| | |
|---|---|
| PATENT NO. | : 10,592,624 B2 |
| APPLICATION NO. | : 15/996307 |
| DATED | : March 17, 2020 |
| INVENTOR(S) | : Sandeep Jana et al. |

It is certified that error appears in the above-identified patent and that said Letters Patent is hereby corrected as shown below:

On the Title Page

Item (73), "Assignee" delete "Synopsis, Inc." and insert --Synopsys, Inc.--

Signed and Sealed this
Fifteenth Day of September, 2020

Andrei Iancu
*Director of the United States Patent and Trademark Office*